US008426266B2

(12) United States Patent
Hoentschel et al.

(10) Patent No.: US 8,426,266 B2
(45) Date of Patent: Apr. 23, 2013

(54) STRESS MEMORIZATION WITH REDUCED FRINGING CAPACITANCE BASED ON SILICON NITRIDE IN MOS SEMICONDUCTOR DEVICES

(75) Inventors: Jan Hoentschel, Dresden (DE); Andreas Kurz, Dresden (DE); Uwe Griebenow, Markleeberg (DE); Thilo Scheiper, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 197 days.

(21) Appl. No.: 12/963,753

(22) Filed: Dec. 9, 2010

(65) Prior Publication Data

US 2011/0269278 A1    Nov. 3, 2011

(30) Foreign Application Priority Data

Apr. 30, 2010  (DE) .................. 10 2010 028 462

(51) Int. Cl.
*H01L 21/8238*    (2006.01)
(52) U.S. Cl.
USPC    438/231; 438/230; 257/E21.64; 257/E21.626
(58) Field of Classification Search .................. 438/231, 438/230, 303; 257/E21.64, E21.626
See application file for complete search history.

(56) References Cited

U.S. PATENT DOCUMENTS

| 6,323,519 | B1 * | 11/2001 | Gardner et al. ............... 257/336 |
| 6,806,154 | B1 | 10/2004 | Lo ................................ 438/303 |
| 7,193,254 | B2 * | 3/2007 | Chan et al. .................... 257/274 |
| 7,439,118 | B2 * | 10/2008 | Kanno ........................... 438/197 |
| 7,550,396 | B2 * | 6/2009 | Frohberg et al. .............. 438/757 |
| 7,601,579 | B2 * | 10/2009 | Kanno ........................... 438/197 |
| 2002/0132407 | A1 * | 9/2002 | Hsien ............................. 438/199 |
| 2005/0093081 | A1 * | 5/2005 | Belyansky et al. ............ 257/392 |
| 2007/0077773 | A1 * | 4/2007 | Frohberg et al. .............. 438/758 |
| 2007/0141775 | A1 * | 6/2007 | Teo et al. ....................... 438/231 |
| 2008/0026572 | A1 * | 1/2008 | Wirbeleit et al. ............. 438/663 |
| 2008/0064191 | A1 * | 3/2008 | Teo et al. ....................... 438/530 |
| 2009/0001371 | A1 * | 1/2009 | Mowry et al. .................. 257/51 |
| 2009/0197381 | A1 * | 8/2009 | Lenski et al. .................. 438/278 |

FOREIGN PATENT DOCUMENTS

DE    102008007003 A1    8/2009

OTHER PUBLICATIONS

Gusev, E. P. "The composition of ultrathin silicon oxynitrides thermally grown in nitric oxide" J. Appl. Phys. 82 (2), Jul. 15, 1997 pp. 896-898.*
Carr, E. C. "N depth profiles in thin SiO2 grown or processed in N2O: The role of atomic oxygen" Appl. Phys. Lett. 66 (12), Mar. 20, 1995 pp. 1492-1494.*
Ellis, K. A. "Nitrous oxide(N2O) processing for silicon oxynitride gate dielectrics" IBM J. Res. Develop. vol. 43 No. May 3, 1999 pp. 287-300.*
Saks, N. S. "Nitrogen depletion during oxidation in N2O" Appl. Phys. Lett. 67 (3), Jul. 17, 1995 pp. 374-376.*
Translation of Official Communication from German Patent Office for German Patent Application No. 10 2010 028 462.9 dated Nov. 25, 2010.

* cited by examiner

*Primary Examiner* — Jae Lee
*Assistant Examiner* — Grant Withers
(74) *Attorney, Agent, or Firm* — Williams, Morgan & Amerson, P.C.

(57) ABSTRACT

In sophisticated semiconductor devices, stress memorization techniques may be applied on the basis of a silicon nitride material, which may be subsequently modified into a low-k dielectric material in order to obtain low-k spacer elements, thereby enhancing performance of sophisticated semiconductor devices. The modification of the initial silicon nitride-based spacer material may be accomplished on the basis of an oxygen implantation process.

18 Claims, 5 Drawing Sheets

STRESS MEMORIZATION WITH REDUCED FRINGING CAPACITANCE BASED ON SILICON NITRIDE IN MOS SEMICONDUCTOR DEVICES

BACKGROUND OF THE INVENTION

1. Field of the Invention

Generally, the present disclosure relates to integrated circuits, and, more particularly, to transistors having strained channel regions by using stress memorization techniques so as to enhance charge carrier mobility in the channel region of a MOS transistor.

2. Description of the Related Art

Generally, a plurality of process technologies are currently practiced to fabricate integrated circuits, wherein, for complex circuitry, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface that is defined by highly doped drain and source regions and an inversely or weakly doped channel region disposed between the drain region and the source region. The conductivity of the channel region, i.e., the drive current capability of the conductive channel, is controlled by a gate electrode located close to the channel region and separated therefrom by a thin insulating layer. The conductivity of the channel region, upon formation of a conductive channel due to the application of an appropriate control voltage to the gate electrode, depends on, among other things, the dopant profile, the mobility of the charge carriers and, for a given extension of the channel region in the transistor width direction, the distance between the source and drain regions, which is also referred to as channel length. Hence, the conductivity of the channel region is a dominant factor that determines the performance of MOS transistors. Thus, the reduction of the channel length, and associated therewith the reduction of the channel resistivity, is an important design criterion for accomplishing an increase in the operating speed of the integrated circuits.

The continuing shrinkage of the transistor dimensions, however, involves a plurality of issues associated therewith, such as reduced controllability of the channel, also referred to as short channel effects, and the like, that have to be addressed so as to not unduly offset the advantages obtained by steadily decreasing the channel length of MOS transistors. For instance, the thickness of the gate insulation layer, typically an oxide-based dielectric, has to be reduced with reducing the gate length, wherein a reduced thickness may result in increased leakage currents, thereby posing limitations for oxide-based gate insulation layers at approximately 1-2 nm. Thus, the continuous size reduction of the critical dimensions, i.e., the gate length of the transistors, necessitates the adaptation and possibly the new development of highly complex process techniques, for example, for compensating for short channel effects with oxide-based gate dielectric scaling being pushed to the limits with respect to tolerable leakage currents. It has, therefore, been proposed to replace silicon dioxide-based dielectrics, at least partially, with so-called high-k dielectric materials having a dielectric constant of 10.0 or higher. Also, the channel conductivity of the transistor elements may be enhanced by increasing the charge carrier mobility in the channel region for a given channel length, thereby offering the potential for achieving a significant performance improvement.

One efficient mechanism for increasing the charge carrier mobility is the modification of the lattice structure in the channel region, for instance by creating tensile or compressive stress in the vicinity of the channel region so as to produce a corresponding strain in the channel region, which results in a modified mobility for electrons and holes, respectively. For example, creating uniaxial tensile strain in the channel region along the channel length direction for a standard crystallographic orientation increases the mobility of electrons, which in turn may directly translate into a corresponding increase in the conductivity. On the other hand, uniaxial compressive strain in the channel region for the same configuration may increase the mobility of holes, thereby providing the potential for enhancing the performance of P-type transistors. The introduction of stress or strain engineering into integrated circuit fabrication is an extremely promising approach, since, for example, strained silicon may be considered as a new type of semiconductor material, which may enable the fabrication of fast powerful semiconductor devices without requiring expensive semiconductor materials, while many of the well-established manufacturing techniques may still be used.

In some approaches, external stress created by, for instance, permanent overlaying layers, spacer elements and the like is used in an attempt to create a desired strain within the channel region. Although a promising approach, the process of creating the strain in the channel region by applying a specified external stress may depend on the efficiency of the stress transfer mechanism for the external stress provided by, for instance, contact layers, spacers and the like into the channel region to create the desired strain therein. Thus, for different transistor types, differently stressed overlayers have to be provided, which may result in a plurality of additional process steps, wherein, in particular, any additional lithography steps may significantly contribute to the overall production costs. Moreover, the amount of stress-inducing material and in particular the intrinsic stress thereof may not be arbitrarily increased without requiring significant design alterations.

Furthermore, upon further scaling the transistor dimensions, the lateral offset between adjacent gate electrode structures of transistors is also reduced, thereby significantly restricting the possibility of depositing highly stressed dielectric materials above the closely spaced transistor elements. Consequently, due to the significant restrictions of any such external strain-inducing mechanisms in sophisticated semiconductor devices, increasingly, internal strain-inducing sources, such as an embedded strained semiconductor alloy, such as silicon/germanium and the like, may be incorporated into the drain and source areas in order to provide a high uniaxial strain component in the adjacent channel region. The well-established silicon/germanium material may be provided in P-channel transistors in order to obtain a high compressive strain, while, on the other hand, tensile strain semiconductor alloys, such as silicon/carbon, may not provide comparable high strain levels due to manufacturing-related issues in providing efficient silicon/carbon material compositions.

In other promising approaches, a substantially amorphized region may be formed in the active region of the transistors laterally adjacent to the gate electrode at an appropriate intermediate manufacturing stage, wherein the amorphized region is then re-crystallized in the presence of a rigid layer formed above the transistor area. For this purpose, silicon nitride material has proven to be a very viable material for the rigid layer since, without intending to restrict the present application to the following explanation, silicon nitride may be provided as a very dense and stiff material, which may thus efficiently force the underlying substantially amorphized semiconductor material to regrow in a highly strained state upon annealing the semiconductor device. That is, during the anneal process for re-crystallizing, the growth of the crystal will occur under stress conditions created by the rigid overlayer, for instance caused by shrinkage of the previously amorphized volume, thereby obtaining a highly tensile strained crystal state. After the re-crystallization, the stress-inducing layer may be partly or completely removed, wherein, nevertheless, a certain amount of strain may be conserved in the re-grown lattice portion. This effect is referred to hereinafter as stress memorization.

Although stress memorization techniques, possibly in combination with efficient silicon/germanium-based strain-inducing mechanisms for P-channel transistors, represent a promising approach for enhancing performance upon further scaling the overall dimensions of transistor elements, other negative influences may have an increasing effect on the overall performance of the transistors. For example, the parasitic capacitance in sophisticated transistors, for instance caused by PN junctions and the like, increasingly contribute to the overall transistor behavior. Similarly, due to the reduced dimensions, the parasitic capacitance of the interconnect elements for providing signals and supply voltages to the highly scaled transistors may increasingly reduce overall performance of the transistors. For example, the fringing capacitance of the gate electrode, i.e., the parasitic capacitance generated between any contact elements and the gate electrode of the transistors, may increasingly contribute to an inferior high frequency behavior of the transistors, wherein the overall dielectric constant of the dielectric material enclosing the gate electrode structure may be one of the dominant contributors to an increased parasitic capacitance. In particular, in efficient stress memorization techniques, the silicon nitride material used for re-crystallizing the amorphized areas in the active region in a tensile strained state may additionally be used as a spacer element after patterning the corresponding silicon nitride overlayer after performing the anneal process. Although using the strain-inducing silicon nitride layer as a spacer material provides a very efficient overall process flow, the presence of the silicon nitride material in the form of a sidewall spacer element at the gate electrode structures may cause an increased parasitic capacitance due to the moderately high-k value of silicon nitride material. On the other hand, the removal of the silicon nitride layer after generating the desired tensile strain component may result in undue process complexity.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques and semiconductor devices wherein transistor performance may be enhanced on the basis of tensile strain created by using stress memorization techniques, while substantially avoiding a negative impact of any spacer elements formed from the silicon and nitrogen-containing spacer layer, for instance in terms of increased permittivity and the like. To this end, the nitrogen contents of the spacer layer may be reduced after the process for re-crystallizing portions of the active regions of transistors in a highly strained state, thereby enabling the continuation of the further processing by forming spacer elements from the modified spacer layer, which may thus have a significantly reduced dielectric constant. The modification of the nitrogen-containing spacer layer may, in some illustrative aspects disclosed herein, be accomplished by incorporating an oxygen species, for instance by ion implantation, and by treating a spacer layer so as to remove at least a portion of the nitrogen species, thereby obtaining a significantly reduced k value of the resulting modified spacer layer. Consequently, stress memorization techniques may be applied on the basis of the highly efficient nitrogen-containing spacer base material, while, at the same time, the finally obtained spacer elements may exhibit a reduced permittivity compared to conventional strategies. Therefore, the principles disclosed herein may be efficiently applied to sophisticated semiconductor devices including planar transistor configurations with a gate length of, for instance, 40 nm and less, wherein the stress memorization technique is "self-scaling," as long as corresponding spacer elements may be required for adjusting the profile of drain and source regions and/or for determining a lateral offset of metal silicide regions and the like. Furthermore, since typically sidewall spacer technologies may be applied in many other concepts for implementing transistors, such as three-dimensional configurations in the form of double channel, triple channel or finFET transistors, the stress memorization techniques disclosed herein may also be efficiently applied in any such three-dimensional structures without negatively contributing to an increased parasitic capacitance.

One illustrative method disclosed herein comprises forming a spacer layer above a first transistor and a second transistor, wherein the spacer layer comprises silicon and nitrogen. Furthermore, the first transistor is formed in and above a first active region and comprises a substantially amorphized semiconductor region in drain and source areas. Similarly, the second transistor is formed in and above a second active region. The method further comprises annealing the first and second transistors so as to re-crystallize the substantially amorphized semiconductor region in the presence of the spacer layer. The method further comprises reducing the amount of nitrogen in the spacer layer and forming a spacer from the spacer layer on sidewalls of gate electrode structures of the first and second transistors.

A further illustrative method disclosed herein comprises forming a nitrogen-containing spacer layer above a first transistor and a second transistor, wherein the first transistor is formed in and above a first active region and comprises a substantially amorphized semiconductor region and wherein the second transistor is formed in and above a second active region. The method additionally comprises annealing the first and second transistors in the presence of the nitrogen-containing spacer layer so as to re-crystallize the substantially amorphized semiconductor region. The method further comprises treating the nitrogen-containing spacer layer so as to reduce the nitrogen contents of the nitrogen-containing spacer layer. Moreover, a spacer is formed on sidewalls of the gate electrode structures of the first and second transistors from the treated nitrogen-containing spacer layer. Additionally, the method comprises forming metal silicide regions in the first and second active regions by using the spacer as a mask.

One illustrative semiconductor device disclosed herein comprises an N-channel transistor formed in and above an active region, wherein the N-channel transistor comprises a tensile strained channel region in the active region. Furthermore, the transistor comprises tensile strained drain and source regions and a gate electrode structure comprising a high-k dielectric material. Additionally, a spacer is formed at sidewalls of the gate electrode structure and comprises silicon, oxygen and nitrogen, wherein the amount of nitrogen is less than the amount of oxygen. Furthermore, metal silicide regions are formed in the active region and have a lateral offset from the gate electrode structure that is determined by the spacer.

BRIEF DESCRIPTION OF THE DRAWINGS

The disclosure may be understood by reference to the following description taken in conjunction with the accompanying drawings, in which like reference numerals identify like elements, and in which.

Figure 1A:
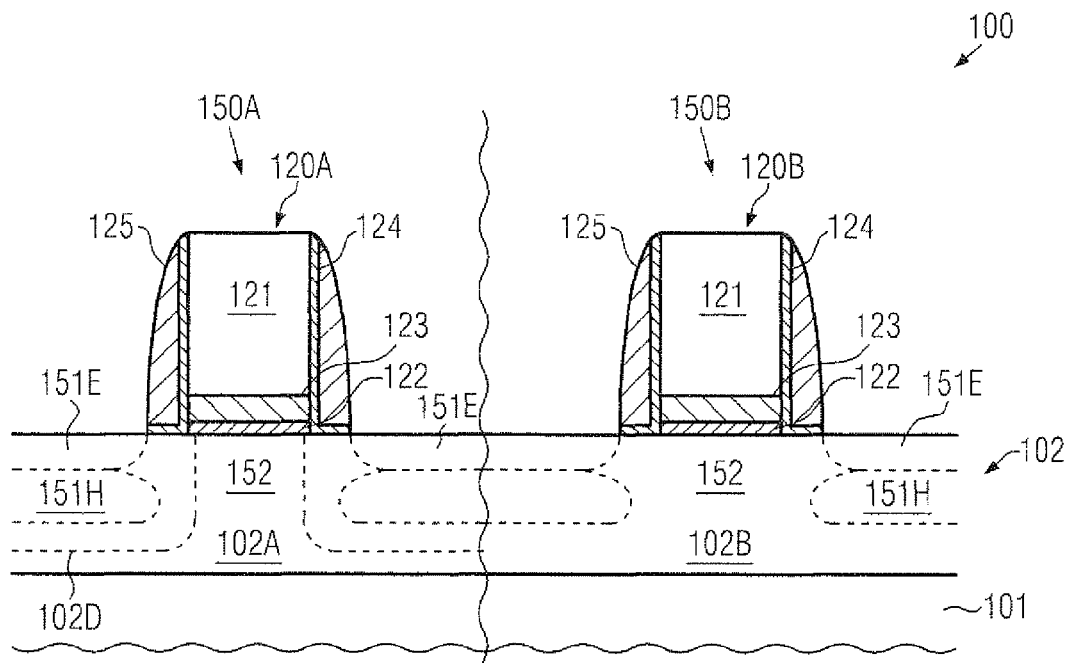
FIGS. 1a-1e schematically illustrate cross-sectional views of a semiconductor device during various manufacturing stages in forming transistors on the basis of a stress memorization technique while reducing the effective dielectric constant of spacer elements, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides methods and semiconductor devices in which stress memorization techniques (SMT) may be efficiently applied during the manufacturing process for advanced transistors, which may have gate electrode structures of critical dimensions of 40 nm and less, if planar transistor architectures are considered, while at the same time the resulting parasitic capacitance, in particular the fringing capacitance, may be reduced compared to conventional approaches by providing a spacer material of reduced dielectric constant. On the other hand, the well-established and highly efficient silicon nitride material may be used for obtaining a highly strained state in some of the transistors, wherein, in some illustrative embodiments, the nitrogen-containing spacer layer may be provided with a high internal stress level, thereby even further enhancing the overall efficiency. Consequently, by using the very efficient nitrogen-containing spacer base material and modifying the material composition so as to obtain a reduced k value, the mechanisms disclosed herein may be efficiently applied to any device architecture and process technology in which superior strain conditions may result in superior device performance, while at the same time a reduced permittivity of a dielectric material in the vicinity of conductive lines at transistor level is required. For example, in planar transistor configurations, the critical dimensions, i.e., the gate length of the gate electrode structures, may be 40 nm and significantly less, such as 30 nm and less, wherein also corresponding pitches between closely spaced gate electrode structures may be a similar order of magnitude, while nevertheless spacer elements may be required for appropriately profiling the drain and source regions and/or adjusting the lateral offset of any metal silicide regions. In this situation, the silicon nitride material may be deposited so as to comply with the overall device architecture as may be required for providing appropriate spacer elements so that the spacer layer may act as an efficient component of the stress memorization technique, while the finally obtained spacers may have a significantly reduced dielectric constant compared to the initial base material. Similarly, in sophisticated three-dimensional transistor architectures, typically, spacer elements may also be required which may be formed on the basis of a modified base material having a reduced dielectric constant which, however, may initially be used for applying a stress memorization technique. For example, transistors having two or more channel regions, which may be configured in a non-planar geometry, such as finFET transistors and the like, may typically be formed on the basis of a process technology requiring the provision of spacer elements, which may thus also be provided on the basis of a material having a reduced dielectric constant compared to silicon nitride spacers, while at the same time providing the possibility of applying efficient stress memorization techniques.

It should be appreciated that, in the context of the present disclosure, a stress memorization technique is to be understood as a process in which a semiconductor region that may comprise a heavily damaged portion or a substantially amorphized portion may be annealed at temperatures that are sufficient to appropriately rebuild the respective crystalline structure, for instance by re-crystallizing the substantially amorphized portion, in the presence of an overlying material layer including silicon and nitrogen in order to obtain a strained lattice structure. That is, a corresponding anneal process is performed in the presence of a cap layer that provides appropriate stress conditions in the semiconductor material in order to enable the creation of a strained state of the semiconductor material during the anneal process, wherein the strained state may be maintained in a more or less pronounced degree when the corresponding cap layer or spacer layer is partially removed. It is to be noted that a corresponding mechanism for creating a strained semiconductor material on the basis of the memorization technique may not yet be fully understood, while nevertheless the principles disclosed herein provide significant advantages with respect to transistor performance, wherein well-controllable process parameters, such as anneal conditions and the like, may be used so as to obtain a reproducible manufacturing strategy.

It should be appreciated that a substantially amorphized semiconductor region is to be understood as a semiconductor region which may represent a portion of an active semiconductor region, which may have a moderately high amount of lattice failures compared to a substantially crystalline area. For example, a concentration of approximately $10^{22}$ lattice defects per $cm^3$ may be understood as a heavily damaged or substantially amorphous semiconductor region. On the other hand, a maximum concentration of $10^{20}$ lattice defects per $cm^3$ may be considered as a crystalline, although damaged semiconductor material.

FIG. 1a schematically illustrates a cross-sectional view of a semiconductor device 100 comprising a substrate 101 and a semiconductor layer 102. The substrate 101 may represent any appropriate carrier material, such as a semiconductor material, an insulation material and the like. As previously indicated, silicon may be used as a base material for fabricating complex integrated circuits and thus frequently the substrate 101 may comprise a silicon material. Similarly, the semiconductor layer 102, although it may be comprised of any appropriate semiconductor material, may typically include a significant amount of silicon, the electronic characteristics of which may be efficiently adjusted on the basis of strain that may be provided locally within the semiconductor layer 102 on the basis of a stress memorization technique. It should be appreciated that the semiconductor layer 102 in combination with the substrate 101 may represent a bulk configuration in which the material of the semiconductor layer 102 may directly connect to a crystalline substrate material of the substrate 101. In other cases, a silicon-on-insulator (SOI) configuration may be provided by the layer 102 and the substrate 101 when a buried insulating material (not shown) is formed between these components.

The semiconductor layer 102 may comprise, in this manufacturing stage, a plurality of isolation regions (not shown), thereby laterally delineating corresponding active regions, such as active regions 102A, 102B. In this context, an active region is to be understood as a semiconductor portion of the layer 102 in which PN junctions of at least one transistor element are formed or are to be formed during the further processing. In the embodiment shown, the active region 102A may correspond to a transistor 150A, such as an N-channel transistor, the performance of which is to be increased on the basis of a stress memorization technique. On the other hand, the active region 102B may correspond to a transistor 150B, such as a P-channel transistor, in which a tensile strain component may not be desired. It should be appreciated, however, that any other configurations for the transistors 150A, 150B may be used, as long as at least one of these transistors may require a tensile strain component in the corresponding active region.

Furthermore, the transistors 150A, 150B may represent planar transistors in which gate electrode structures 120A, 120B, respectively, may be provided above the respective active regions 102A, 102B so as to define a planar channel region 152, the conductivity of which is controlled by the respective gate electrode structure 120A, 120B. Thus, in FIG. 1a, the general current flow direction corresponds to the horizontal direction in the channel region 152. In the manufacturing stage shown, the gate electrode structures 120A, 120B may have any appropriate configuration, for instance comprising a gate dielectric material 122 in combination with one or more electrode materials, such as materials 123 and 121. For example, in some illustrative embodiments, the gate dielectric material 122 may comprise a high-k dielectric component, for instance in the form of hafnium oxide, hafnium silicon oxide, zirconium oxide and the like, so as to provide an increased dielectric constant compared to conventional dielectric materials, such as silicon dioxide, silicon oxynitride and the like. It should be appreciated that the gate dielectric material 122 may also comprise a conventional dielectric material wherein, however, due to the incorporation of any high-k dielectric component, the overall permittivity of the gate dielectric material 122 may be higher for a given thickness thereof compared to a gate dielectric material that may be completely comprised of a conventional dielectric material. In this manner, an oxide equivalent thickness of 1.5 nm and significantly less may be obtained, while the physical thickness may be 1.5 nm and greater. Furthermore, when providing a high-k dielectric component in the gate dielectric material 122, frequently, a conductive cap material, such as the layer 123, may be provided so as to encapsulate the sensitive gate dielectric material and to act as an electrode metal. For example, the layer 123 may be comprised of titanium nitride and the like. Furthermore, the electrode material 121 may be provided in the form of a silicon material, such as amorphous material, polysilicon and the like. Consequently, by using a sophisticated configuration of the gate electrode structures 120A, 120B, superior performance, even for extremely reduced transistor dimensions, may be achieved. In particular, for any such sophisticated gate electrode structures, a reduced fringing capacitance may be required since, due to the reduced lateral dimensions, typically, any contact elements and the like may have to be provided in close proximity to the gate electrode structures.

It should be appreciated that, in other illustrative embodiments (not shown), the gate electrode structures 120A, 120B may comprise conventional materials, such as silicon dioxide, silicon nitride and the like, in combination with a silicon material, wherein, depending on the overall process strategy, one or both of these materials may be replaced in a very advanced manufacturing stage with sophisticated materials, such as a high-k dielectric material and metal-containing electrode materials. Furthermore, in the embodiment shown, a protective liner 124, for instance comprised of silicon nitride, may be provided on sidewalls of the materials 121, 123 and 122, thereby providing superior integrity of, in particular, the sensitive materials 123 and 122. Furthermore, in the manufacturing stage shown, a spacer element 125, for instance comprised of silicon dioxide, may be provided so as to substantially cover the liner 124. For example, the spacer may be provided in the form of a silicon dioxide material, thereby providing a reduced overall parasitic capacitance, while, on the other hand, the thickness of the material 124 may be two to several nanometers, which may not unduly affect the overall electrical characteristics of the gate electrode structures 120A, 120B.

The transistor 150A may further comprise drain and source extension regions 151E, the lateral offset of which may be substantially determined by the spacer 125. Furthermore, counter-doped regions or halo regions 151H may be provided with any appropriate profile in the vertical and horizontal direction so as to obtain the desired transistor performance.

Furthermore, in the manufacturing stage shown, a substantially amorphized region 102D may be provided within the active region 102A such that the implantation regions 151E, 151H may be substantially embedded in the substantially amorphized region 102D.

Similarly, the transistor 150B may comprise drain and source extension regions 151E, which may be of inverse conductivity type compared to those of the transistor 150A, when the transistors 150A, 150B represent complementary transistors. Similarly, the counter-doped regions 151H may be provided and may be counter-doped with respect to drain and source extension regions 151E. It should be appreciated that the active region 102B may not comprise a substantially amorphized portion and thus the concentration of lattice defects in the active region 102B, for instance caused by any preceding implantation processes, may be significantly less compared to the active region 102A.

The semiconductor device 100 as illustrated in FIG. 1a may be formed on the basis of any appropriate process strategy. For example, the active regions 102A, 102B may be formed by providing isolation structures (not shown) and introducing a specific base doping in accordance with the conductivity type of the transistors 150A, 150B, respectively. To this end, well-established implantation techniques and masking regimes may be applied. Thereafter, the gate electrode structures 120A, 120B may be formed by applying appropriate materials and patterning the same using sophisticated lithography and etch techniques. After patterning the materials 122, 123 and 121, the liner 124 may be formed and subsequently a spacer material may be deposited, which may subsequently be patterned into the spacer 125. If required, any further processes may be performed, for instance embedding a strain-inducing semiconductor material, such as a silicon/germanium material, in order to enhance transistor performance. A mask implantation sequence may be performed so as to obtain the extension regions 151E and the halo regions 151H in the transistors 150A, 150B, wherein an additional pre-amorphization implantation step may be applied so as to form the substantially amorphized region 102D in the active region 102A. It should be appreciated that, if desired, the extension regions 151E and the halo regions 151H may be formed on the basis of a pre-amorphization implantation in both transistors 150A, 150B with a subsequent anneal process for re-crystallizing any implantation-induced damage. Thereafter, the substantially amorphized portion 102D may be selectively formed in the active region 102A. In other cases, generally, a significantly reduced degree of lattice damage may be obtained in the active region 102B when the implantation process may be performed on the basis of boron in order to form the extension regions 151E therein. On the other hand, the counter-doped halo region 151H of the transistor 150B may generally require a significantly reduced implantation dose so that a corresponding implantation-induced damage may nevertheless be significantly less compared to the N-type doping in the active region 102A when representing an N-channel transistor.

Figure 1B:
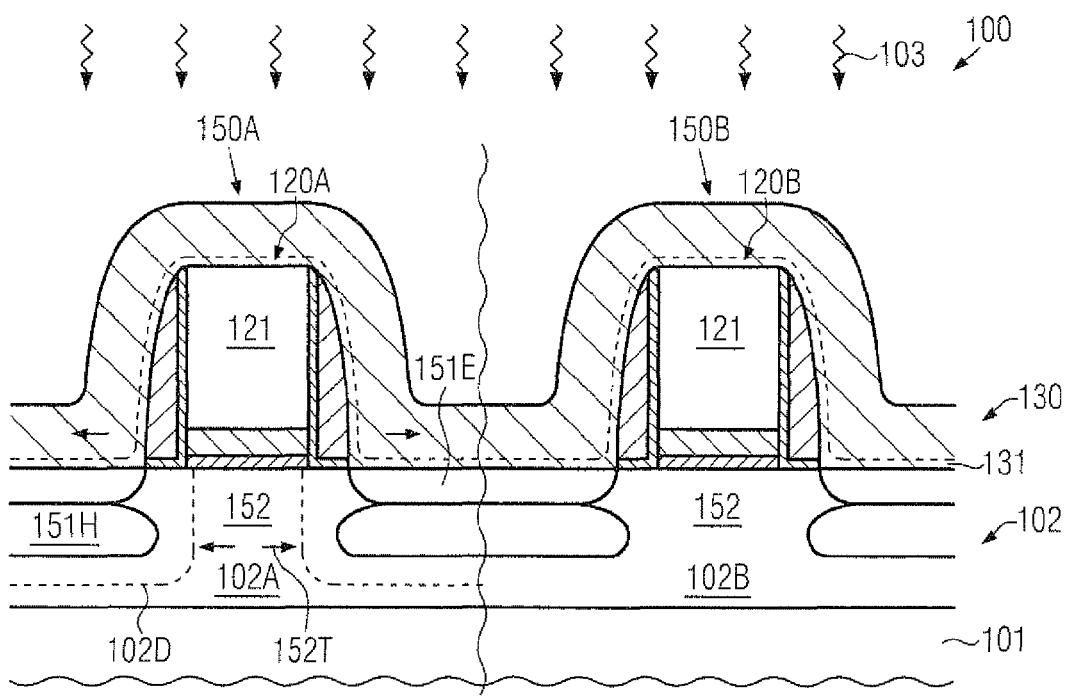

FIG. 1b schematically illustrates the semiconductor device 100 in a further advanced manufacturing stage. As illustrated, a spacer layer 130 may be formed above the transistors 150A, 150B and may have an appropriate thickness so as to enable the patterning of spacer elements in a further manufacturing stage. Moreover, the spacer layer 130 may comprise a nitrogen species and may represent, in some illustrative embodiments, a silicon nitride material which may be efficiently used as a rigid overlayer during a stress memorization technique, as is also discussed above. In some illustrative embodiments, the spacer layer 130 may be provided in combination with an etch stop layer 131, such as a silicon dioxide layer, having a thickness of two to several nanometers, while the spacer layer 130 may have a thickness of 10-60 nm or higher, depending on the finally desired spacer width. Moreover, in some illustrative embodiments, the spacer layer 130 may be provided with a high internal stress level, for instance with an internal tensile stress of 1 GPa or higher, which may further enhance the overall efficiency of inducing a desired tensile strain in the active region 102A.

The etch stop layer 131, if provided, may be formed on the basis of any appropriate deposition technique, such as plasma enhanced chemical vapor deposition (CVD) and the like. Similarly, the spacer layer 130 may be formed on the basis of plasma enhanced CVD techniques in which, if desired, process parameters, such as deposition temperature, pressure, ion bombardment and the like, may be adjusted so as to obtain a desired internal stress level, such as a high tensile stress component. It should be appreciated that a plurality of deposition recipes are well established in the art in order to provide silicon nitride material with a high internal stress level. For example, dielectric overlayers having a high internal stress level provided after completing the basic transistor configuration have been an efficient strain-inducing mechanism, as described above, and corresponding deposition recipes may also be used for providing the spacer layer 130, wherein, however, a thickness thereof may be appropriately adjusted to the overall device geometry, as is also discussed above. Consequently, the spacer layer 130 may act on the underlying active regions 102A, 102B, wherein, in particular, the region 102A may comprise the substantially amorphized portion 102D, while the active region 102B may be in a substantially crystalline state. Next, an anneal process 103 may be applied so as to initiate the re-crystallization of the substantially amorphized portion 102D, which may be accomplished by any appropriate anneal technique, such as rapid thermal anneal processes, laser-based anneal techniques, flashlight-based anneal techniques, wherein an effective process temperature of 550-700° C. and higher may be applied so as to obtain the desired crystal growth, while the degree of dopant diffusion may also be adjusted, in accordance with process and device requirements. As previously explained, during the anneal process 103, the region 102D may be increasingly re-crystallized, thereby adopting the lattice structure of the surrounding substantially crystalline areas in the active region 102A, thereby resulting in a highly tensile strained state, as indicated by 152T, within the channel region 152 and also within the drain and source areas, i.e., in and below the extension regions 151E and the halo regions 151H. It should be appreciated that any tensile strain component induced in the transistor 150B may be substantially of a temporary nature since the active region 102B may not significantly rearrange its crystalline status, due to the significantly reduced defect rate compared to the portion 102D in the transistor 150A, while the strain induced by the material 130 may be significantly reduced upon removing a portion of the layer 130 in a later manufacturing stage. Moreover, as will be explained later on with reference to FIG. 1c, an efficient stress relaxation may be accomplished in the layer 130 prior to patterning spacer elements from this layer.

Figure 1C:
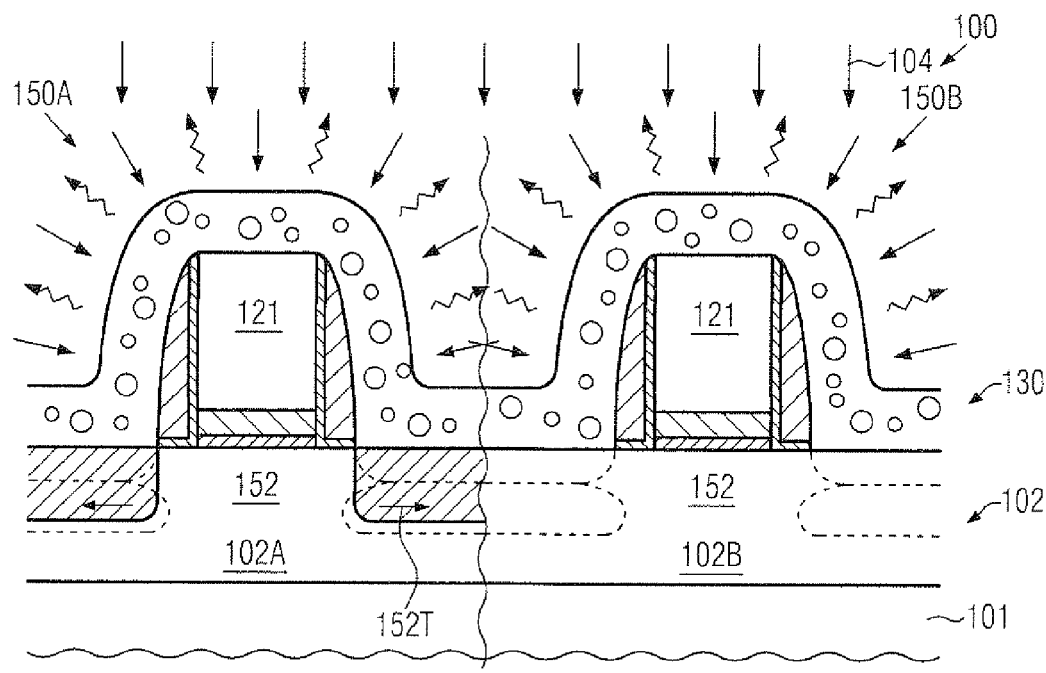

FIG. 1c schematically illustrates the device 100 in a further advanced manufacturing stage. As illustrated, the device 100 may be exposed to a process 104 in which the material characteristics of the layer 130 in terms of dielectric constant may be significantly modified. In some illustrative embodiments, the process 104 may comprise an ion implantation process for incorporating an appropriate species, which may interact with the base material of the layer 130 so as to remove at least a portion of the initial nitrogen contents. For example, during the process 104, oxygen may be incorporated into the layer 130 and at the same time nitrogen may be driven out of the layer 130, thereby increasingly forming a "silicon dioxide-like" material layer, thereby also reducing the effective dielectric constant of the layer 130. For this purpose, the process 104 may comprise an ion implantation process implanting an oxygen species with a high dose, for instance with a dose of up to $10^{18}$ per $cm^2$, with an implant energy of several tenths keV to two hundred keV, depending on the thickness of the spacer layer 130. Moreover, during the implantation process, elevated temperatures may also be applied, for instance of approximately 300° C. to several hundred degree Celsius, thereby initiating the "out carriage" of the nitrogen species. Consequently, during the treatment 104, oxygen clusters may form in the layer 130 and may endow the layer 130 with a reduced dielectric constant. It should be appreciated that appropriate process parameters may be readily established by experiments in which the reduction of the dielectric constant may be determined for several implantation parameter settings in combination with elevated temperatures, possibly in combination with additional treatments after the process 104.

Figure 1D:
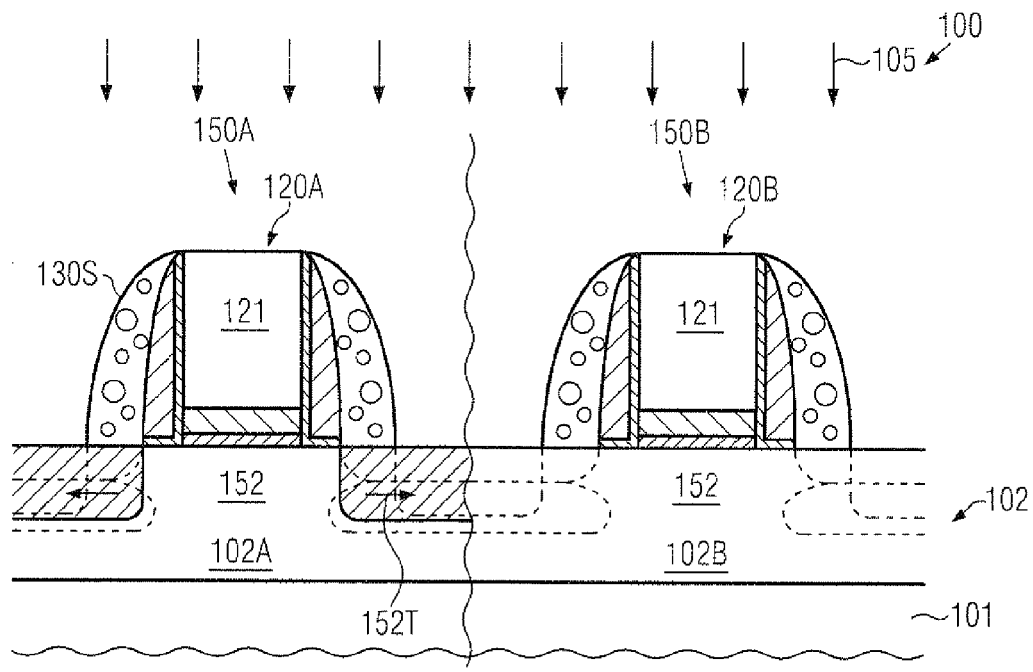

FIG. 1d schematically illustrates the semiconductor device 100 during an etch process 105, in which spacer elements 130S may be obtained from the spacer layer 130 after the modification process 104 (FIG. 1c). The etch process 105 may be performed on the basis of appropriately selected process parameters and an etch chemistry so as to take into consideration the modified etch behavior of the previously modified spacer layer, which may be readily accomplished by performing experiments and starting from well-established spacer etch techniques for silicon nitride materials. The spacers 130S may thus have a material composition in which oxygen may be incorporated and may replace, to a certain degree, the initial nitrogen species, thereby providing, in total, a higher amount of oxygen compared to nitrogen, which may thus result in a reduced dielectric constant compared to conventional silicon nitride-based spacer elements. Additionally, the preceding process 104 (FIG. 1c), when comprising a high dose implantation process, may contribute to a significant reduction of the initial stress level in the layer 130, so that the spacers 130S may represent a stress relaxed material, thereby not unduly contributing to a tensile strain component in the transistor 150B. On the other hand, the strain 152T may be substantially completely preserved in the transistor 150A, as is also previously explained.

Figure 1E:
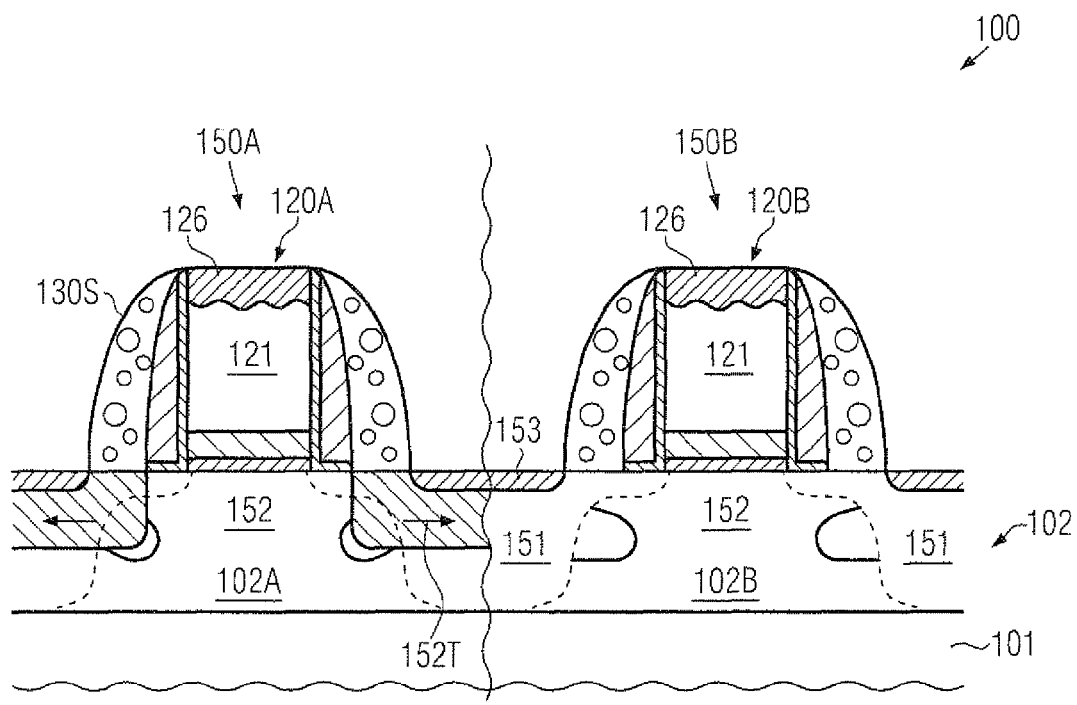

FIG. 1e schematically illustrates the device 100 in a further advanced manufacturing stage. As shown, drain and source regions 151 may be provided in the active regions 102A, 102B and may appropriately connect to the extension regions 151E and the halo regions 151H (see FIG. 1a), which may still comprise the strained state 152T in the active region 102A. Furthermore, a metal silicide 153 may be provided in the drain and source regions, wherein a lateral offset of the metal silicide 153 with respect to the gate electrode structures 120A, 120B may be substantially determined by the low permittivity spacer 130S. Moreover, in the embodiment shown, a metal silicide 126 may also be provided in the gate electrode structures 120A, 120B.

The device 100 as illustrated in FIG. 1e may be formed on the basis of any appropriate process strategy in order to provide the drain and source regions 151, thereby using the spacer 130S as an implantation mask, which thus defines the desired lateral profile of the drain and source regions 151. After any appropriate anneal processes, the metal silicide regions 153, possibly in combination with the metal silicide regions 126, may be formed in accordance with any appropriate silicidation process, wherein the spacer elements 130S may substantially determine the lateral offset from the gate electrode structure.

Thereafter, the further processing may be continued by depositing any appropriate dielectric material and forming contact elements therein so as to connect to the active regions 102A, 102B and to the gate electrode structures 120A, 120B. Thus, due to the reduced dielectric constant of the spacer elements 130S, any parasitic capacitance between neighboring gate electrode structures and between any contact elements in the gate electrode structures may be reduced, thereby providing superior high frequency characteristics of the semiconductor device 100.

In other illustrative embodiments (not shown), the processing may be continued by replacing a portion of the gate electrode structures 120A, 120B in order to provide superior performance of these structures. To this end, the gate electrode structures 120A, 120B may have received an appropriate cap material, for instance for avoiding a silicidation of any underlying material, and the cap material may be removed upon laterally embedding the gate electrode structures in any appropriate dielectric material. Thereafter, the material 121 may be replaced with any other appropriate material, a high-k dielectric material may be applied if any such material may not have been provided in an early manufacturing stage. Consequently, sophisticated replacement gate approaches may be applied while also in this case a certain degree of the initial strain may be preserved and the low permittivity spacers 130S may provide superior performance.

It should further be appreciated that, in other illustrative embodiments (not shown), two or more spacer elements, such as the spacer 130S, may be provided sequentially so as to obtain a more complex lateral drain and source profile, while also providing superior strain conditions in the active region 102A. Also in this case, each respective spacer layer may be treated as described above for the layer 130, and thus the dielectric constant thereof may be reduced prior to actually patterning a corresponding spacer element.

Figure 1F:
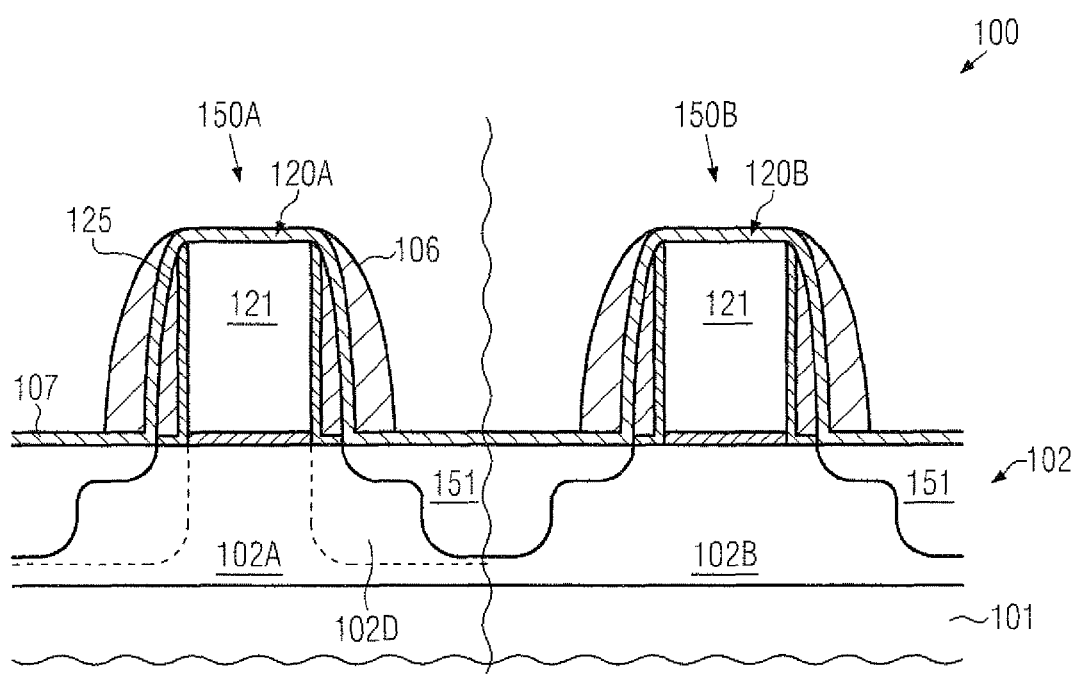
FIGS. 1f-1i schematically illustrate cross-sectional views of the semiconductor device according to further illustrative embodiments in which superior strain conditions may be obtained on the basis of a stress memorization technique, while avoiding undue parasitic capacitance of the resulting spacer structure.

FIG. 1f schematically illustrates the semiconductor device 100 according to further illustrative embodiments in which the drain and source regions 151 may be formed on the basis of a sacrificial spacer element 106, such as a silicon nitride spacer and the like. To this end, the spacer element 106 may be formed on the basis of well-established process techniques, for instance in combination with an etch stop layer 107, such as a silicon dioxide material. When forming the drain and source regions 151, the substantially amorphized region 102D may be selectively provided in the active region 102A, as is also previously described. Furthermore, when lattice damage in the active region 102A caused by the preceding implantation process is considered inappropriate, an anneal process may be performed so as to substantially re-crystallize the active regions 102A, 102B and subsequently a pre-amorphization implantation process may be selectively applied to the active region 102A so as to form the heavily damaged region 102D. Next, an appropriate etch process may be applied to remove the spacer element 106, for instance selectively with respect to the etch stop layer 107, which may then also be removed, for instance on the basis of well-established wet chemical etch techniques and the like.

Figure 1G:
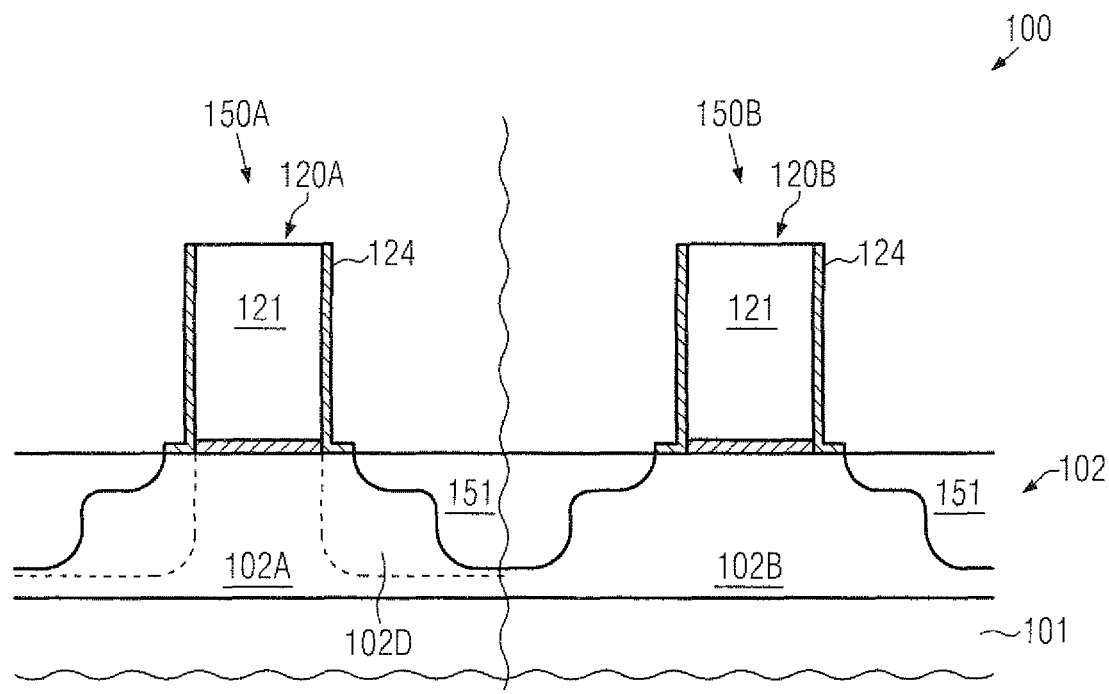

FIG. 1g schematically illustrates the device 100 according to illustrative embodiments in which the spacer element 125 (FIG. 1f) may have been removed, for instance together with the etch stop layer 107, if desired. Consequently, the drain and source regions 151 of the transistor 150A may be provided in a highly damaged state due to the amorphized region 102D, while a corresponding damage in the active region 102B may be significantly less pronounced, since generally the incorporation of boron as a P-type dopant species may result in a significantly reduced crystal damage. In other cases, the substantially amorphized portion 102D may form selectively in the active region 102A in this manufacturing stage on the basis of an implantation process, in which the transistor 150B may be masked.

Figure 1H:
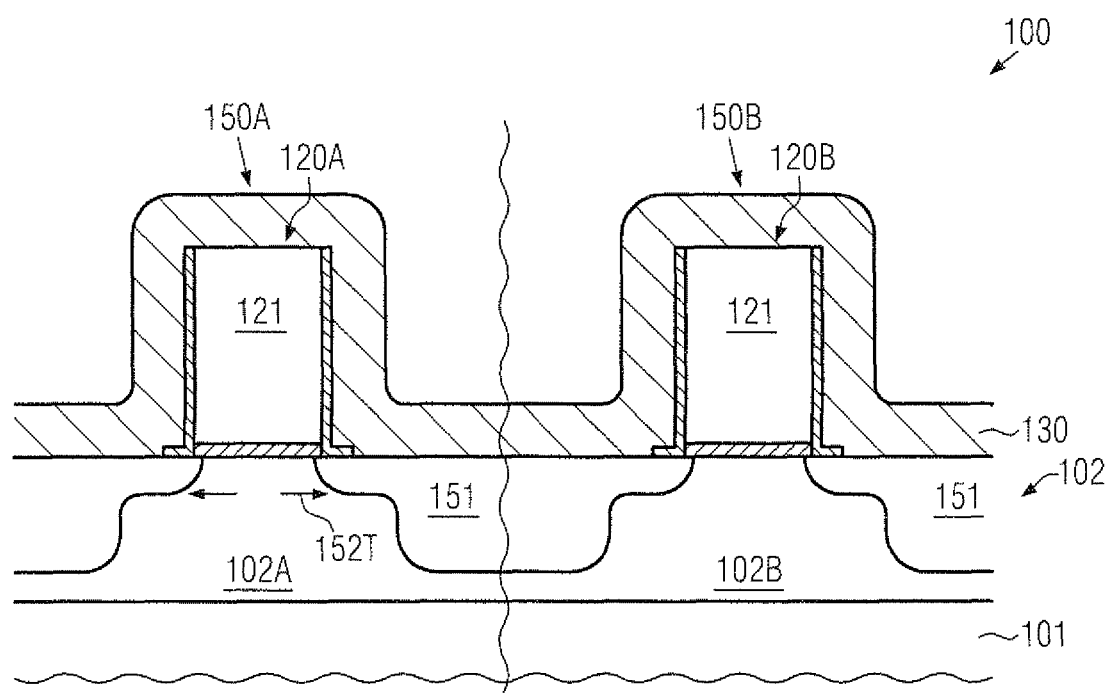

FIG. 1h schematically illustrates the semiconductor device 100 in a further advanced manufacturing stage in which the spacer layer 130 may be formed above the transistors 150A, 150B and may be annealed so as to obtain the desired tensile strain component 152T. Thereafter, the process 104 (FIG. 1c) may be applied so as to reduce the dielectric constant and the further processing may be continued by etching the modified spacer layer 130 into the corresponding spacer elements.

Figure 1I:
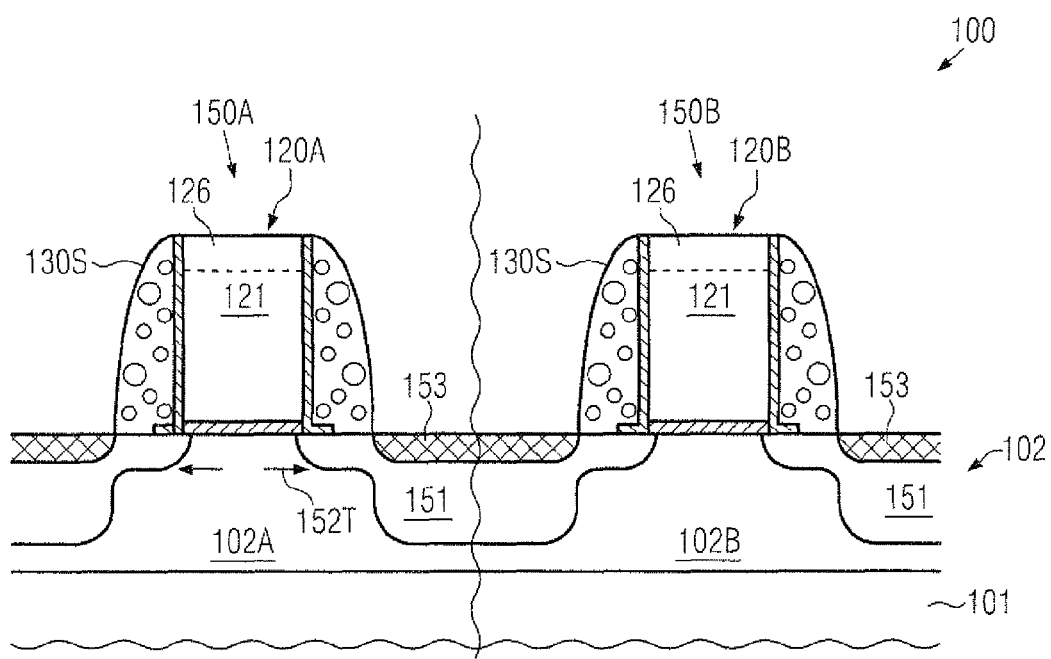

FIG. 1i schematically illustrates the device 100 with the spacer elements 130S formed on sidewalls of the gate electrode structures 120A, 120B. Furthermore, metal silicide regions 153 may be provided in the drain and source regions 151 with a lateral offset that is substantially determined by the spacer 130S. Consequently, the width of the spacers 130S may be appropriately selected so as to obtain the desired offset of the metal silicide regions 153, without requiring a consideration of the lateral profile of the drain and source regions 151. Furthermore, depending on the overall process strategy, metal silicide regions 126 may be formed in the gate electrode structures 120A, 120B, while in other cases a replacement gate approach may be applied in which gate electrode materials may be provided in the gate electrode structures 120A, 120B, possibly in combination with a high-k dielectric material, in a later manufacturing stage.

As a result, the present disclosure provides semiconductor devices and manufacturing techniques in which sophisticated transistors may be provided on the basis of a spacer technique, which may have a reduced dielectric constant compared to conventional silicon nitride spacer elements, wherein, additionally, the spacer elements may be made from a silicon nitride-based spacer layer, which may be efficiently used during a stress memorization process. Consequently, efficient "self-scaling" internal strain-inducing mechanisms for transistors requiring tensile strain may be applied on the basis of well-established silicon nitride materials, possibly provided in the highly tensile stressed state, while this material may also be used as an efficient low-k material for spacer elements. To this end, the spacer layer may be modified, for instance by oxygen implantation and heat treatment, in order to reduce the initial dielectric constant.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a spacer layer above a first transistor and a second transistor, said spacer layer comprising silicon and nitrogen, said first transistor being formed in and above a first active region and comprising a substantially amorphized semiconductor region in drain and source areas, said second transistor being formed in and above a second active region;
    annealing said first and second transistors so as to re-crystallize said substantially amorphized semiconductor region in the presence of said spacer layer;
    reducing the amount of nitrogen in said spacer layer; and
    forming a spacer from said spacer layer on sidewalls of gate electrode structures of said first and second transistors.

2. The method of claim 1, wherein reducing the amount of nitrogen in said spacer layer comprises incorporating at least one non-nitrogen species by performing an ion implantation process.

3. The method of claim 2, wherein said at least one non-nitrogen species comprises oxygen.

4. The method of claim 1, further comprising forming a portion of drain and source regions of said first and second transistors by using said spacer as an implantation mask.

5. The method of claim 1, wherein forming said spacer layer comprises depositing a silicon and nitrogen containing material layer so as to have an internal stress level of 1 GPa (Giga Pascal) or higher.

6. The method of claim 1, further comprising forming a first gate electrode structure of said first transistor and a second gate electrode structure of said second transistor with a gate length of 40 nm or less.

7. The method of claim 6, wherein forming said first and second gate electrode structures comprises providing a high-k dielectric material in a gate insulation layer of said first and second gate electrode structures.

8. The method of claim 1, further comprising forming a second spacer layer comprising silicon and nitrogen, reducing the amount of nitrogen in said second spacer layer and forming a second spacer from said second spacer layer having a reduced amount of nitrogen.

9. The method of claim 1, further comprising forming a sacrificial spacer on sidewalls of said gate electrode structures of said first and second transistors, forming drain and source regions of said first transistor so as to be embedded in said substantially amorphized semiconductor region by using said sacrificial spacer as an implantation mask and removing said sacrificial spacer prior to forming said spacer layer.

10. The method of claim 9, further comprising forming metal silicide regions in said first and second active region by using said spacer as a mask.

11. A method, comprising:
    forming a nitrogen-containing spacer layer above a first transistor and a second transistor, said first transistor being formed in and above a first active region comprising a substantially amorphized semiconductor region, said second transistor being formed in and above a second active region;

annealing said first and second transistors in the presence of said nitrogen-containing spacer layer so as to re-crystallize said substantially amorphized semiconductor region;

treating said nitrogen-containing spacer layer so as to reduce a nitrogen content of said nitrogen-containing spacer layer;

forming a spacer on sidewalls of gate electrode structures of said first and second transistors from said treated nitrogen-containing spacer layer; and forming metal silicide regions in said first and second active regions by using said spacer as a mask.

12. The method of claim 11, wherein treating said nitrogen-containing spacer layer comprises performing an ion implantation process using an oxygen implant species.

13. The method of claim 11, further comprising forming a sacrificial spacer on sidewalls of said gate electrode structures and forming drain and source regions in the first and second active regions by using said sacrificial spacer as a mask prior to forming said nitrogen-containing spacer layer.

14. The method of claim 11, further comprising forming drain and source regions in said first and second active regions by using said spacer as an implantation mask.

15. The method of claim 11, wherein forming said nitrogen-containing spacer layer comprises forming a silicon and nitrogen containing material layer so as to have a high tensile stress.

16. The method of claim 11, further comprising forming an etch stop layer prior to forming said nitrogen-containing spacer layer and using said etch stop layer when forming said spacer.

17. The method of claim 11, wherein said first transistor is an N-channel transistor and said second transistor is a P-channel transistor.

18. The method of claim 11, wherein said gate electrode structures are formed so as to comprise a gate dielectric layer including a high-k dielectric material.

* * * * *